United States Patent [19]

Symonds

[11] Patent Number: 5,049,879

[45] Date of Patent: Sep. 17, 1991

[54] POSITION ENCODER UTILIZER SPECIAL GRAY CODE

[75] Inventor: Dean H. Symonds, Cherryvale, Kans.

[73] Assignee: Deere & Company, Moline, Ill.

[21] Appl. No.: 606,239

[22] Filed: Oct. 31, 1990

[51] Int. Cl.⁵ .................... H03M 1/24; H03M 1/28
[52] U.S. Cl. .................................. 341/10; 341/13; 341/2
[58] Field of Search ............ 341/10, 13, 15, 2, 9, 341/16, 17; 250/231 SE, 566, 568, 570; 364/559; 318/652, 603

[56] References Cited

U.S. PATENT DOCUMENTS

| | | | |
|---|---|---|---|
| 4,382,250 | 5/1983 | Radselli | 341/13 |
| 4,422,065 | 12/1983 | Radomirov et al. | 341/2 |
| 4,443,788 | 4/1984 | Breslow | 341/9 |
| 4,445,110 | 4/1984 | Breslow | 341/10 |
| 4,445,112 | 4/1984 | Haville | 341/9 |
| 4,465,928 | 8/1984 | Breslow | 341/13 X |
| 4,604,725 | 8/1986 | Davies et al. | 364/900 |
| 4,621,256 | 11/1986 | Rusk | 250/231 SE X |
| 4,628,298 | 12/1986 | Hafle et al. | 341/1 |
| 4,730,110 | 3/1988 | Spaulding | 341/2 X |
| 4,896,135 | 1/1990 | Deeds et al. | 340/456 |
| 4,901,072 | 2/1990 | Fox | 341/10 |

Primary Examiner—A. D. Pellinen
Assistant Examiner—Sharon D. Logan

[57] ABSTRACT

A position encoder includes a plurality of encoded elements or disks, each of which has indicia representative of a bit of a five bit digital word of a Gray code. Each disk is mechanically coupled to a lever or movable member. A sensor is positioned adjacent to each disk so that the sensors produce digital signals in response to the indicia. The indicia are arranged so that if only one bit of any word is changed, then the modified word will either be a) identical to a word representing an adjacent position of the lever, or b) different from all the words which represent lever positions.

1 Claim, 2 Drawing Sheets

POSITION ENCODER UTILIZER SPECIAL GRAY CODE

BACKGROUND OF THE INVENTION

This invention relates to a position encoder which produces a digital indication of the position of a movable mechanical member.

Typically, an electronic transmission control system for a multiple gear ratio vehicle transmission will include a multiposition gear selector lever and a linear and rotary encoder which supplies a signal or code representing the position of the lever to a electronic control unit. The encoder will be connected to the control unit by wires or circuits. It is well known that linear and rotary encoders use so called Gray codes to avoid ambiguous readings as the bits change between digital words. Gray codes (which may have redundant bits) change only one bit at a time between adjacent positions. That is, words relating to adjacent positions are identical except for one bit. However, a fault in the wires or circuit can change one or more bits of the digital word received by the control unit. It can be expected that a typical fault might affect only a single bit. However, with previously proposed Gray codes even a change in only one bit could cause the digital word received by the control unit to change to a word which would represent a large change in the position of the gear selector lever. This could be dangerous in a transmission system with multiple forward and reverse gear ratios. For example, in a transmission system with eight forward gear ratios and four reverse gear ratios, if the gear selector was in a forward high gear ratio position, it would be dangerous if an error in one bit changed the digital word to a word which represented a reverse gear ratio.

SUMMARY OF THE INVENTION

An object of the present invention is to provide a position encoder for a transmission gear selector lever wherein an error in a single bit of the words generated by the encoder does not cause dangerous shifts of the transmission.

This and other objects are achieved by the present invention wherein a position encoder includes a plurality of encoded elements or disks, each of which has indicia representative of a bit of a five bit digital word of a Gray code. Each disk is mechanically coupled to a lever or movable member. A sensor is positioned adjacent to each disk so that the sensors produce digital signals in response to the indicia. The indicia are arranged so that if only one bit of any word is changed, then the modified word will either be a) identical to a word representing an adjacent position of the lever, or b) different from all the words which represent lever positions (an illegal word).

DETAILED DESCRIPTION

Figure 1:
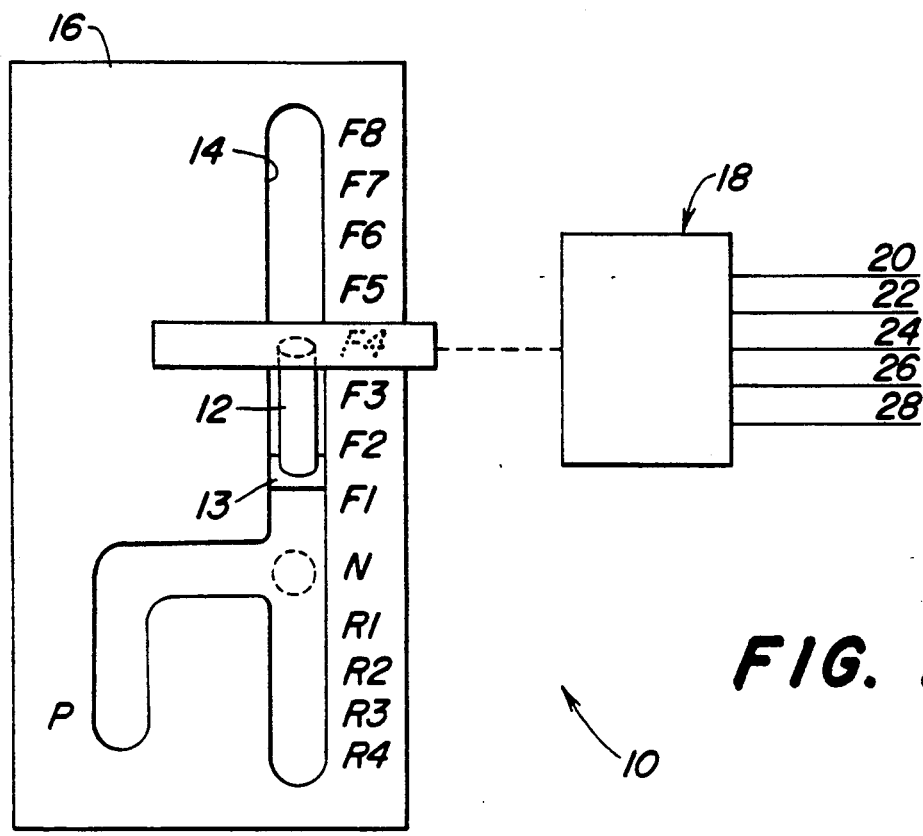
FIG. 1 is a simplified schematic illustration of a gear selector coupled to a position encoder.

Referring to FIG. 1, a gear selector arrangement 10 includes a manually operated lever 12 which is pivotal about the axis of shaft 13 and thereby movable to a plurality of positions in a slot 14 in a guide housing 16. The lever 12 is coupled to an encoder 18 which provides signals on wires 20-28 which represent the position of the lever 12. The wires 20-28 may be connected to the electronic control unit (not shown) of a control system for a transmission. The transmission, the control system and the electronic control unit are not shown because they form no part of the present invention which is concerned only with the encode 18 and the signals or codes which are generated by it.

Figure 2:
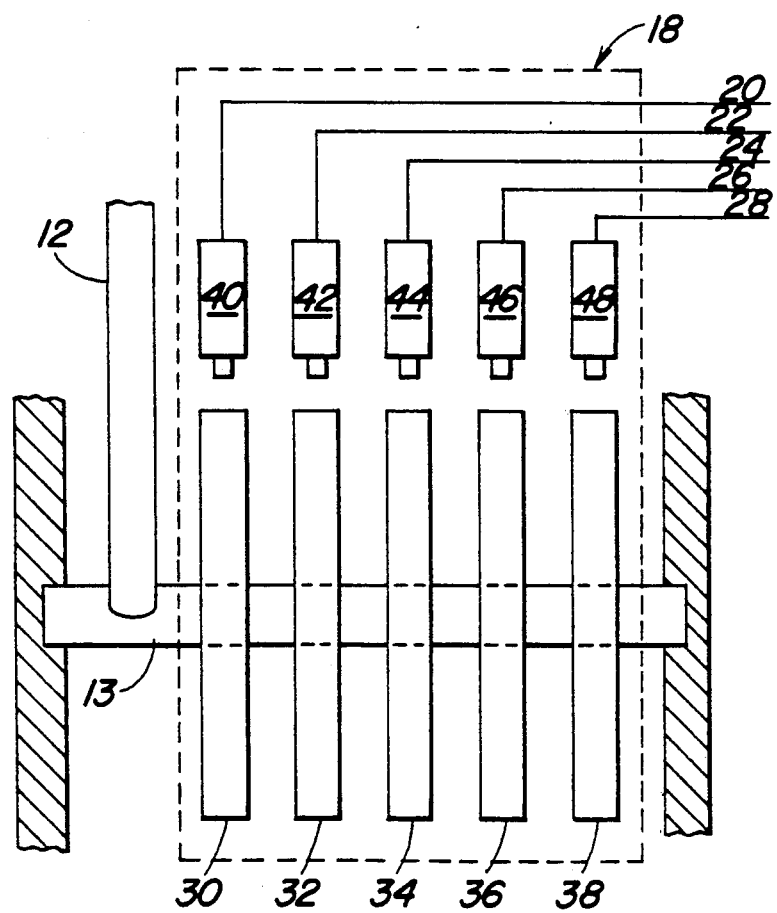
FIG. 2 is a simplified illustration of a position encoder constructed according to the present invention.
Figure 3A:
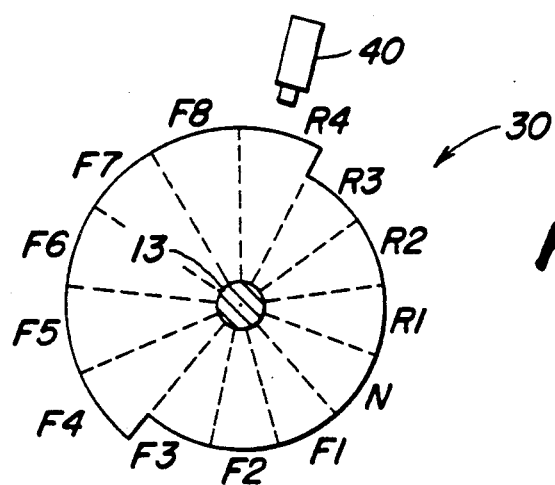
FIGS. 3a–3e are schematic diagrams of toothed disks and associated sensors which may be used to produce the bit sequences of the modified Gray code of the present invention.
Figure 3B:
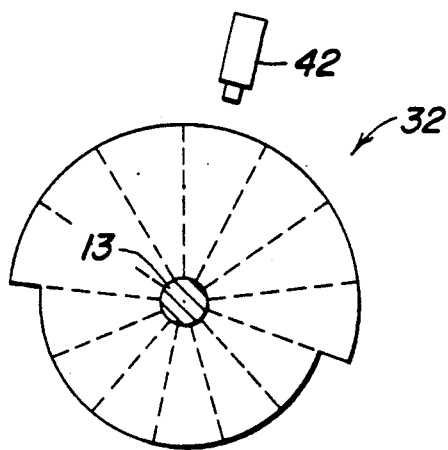
Figure 3C:
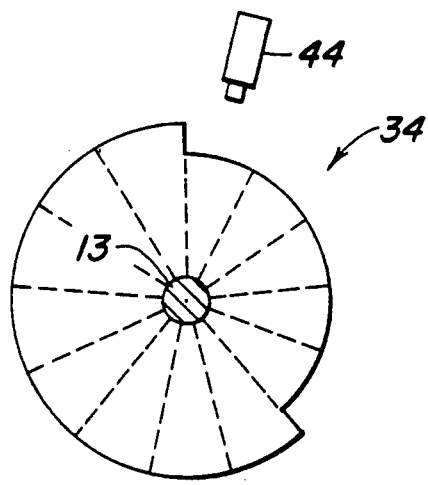
Figure 3D:
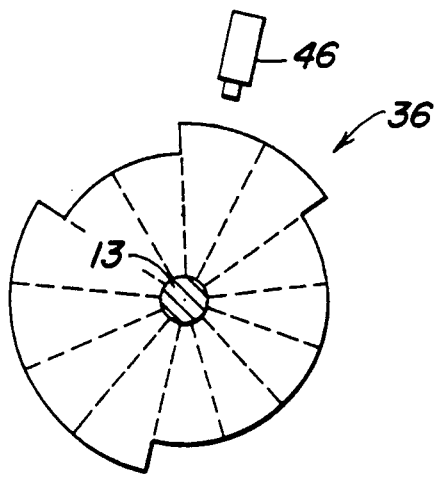
Figure 3E:
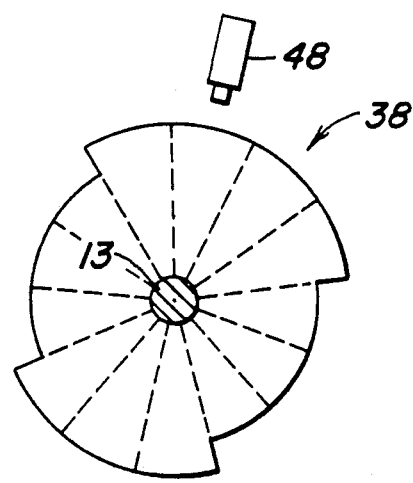

Referring now to FIG. 2, the encoder 18 includes a plurality of encoded elements or disks 30–38 which are mounted for rotation with the shaft 13 which rotates as the lever 12 is pivoted. A plurality of sensors 40–48 are mounted so that each sensor is adjacent the periphery of a corresponding one of the encoded elements or disks 30–38. The sensors 40–48 may be variable reluctance sensors, permanent magnet voltage pickups or microswitches which have actuating elements which are engageable with the periphery of the encoded elements or disks 30–38.

Referring now to FIGS. 3a–3e, the periphery of each disk 30–38 may be considered to be divided into a number of sections, the number of which will be equal to the number of positions of the lever 12. For example, in this case the lever 12 is movable among 13 positions, including eight forward gear positions F1-F8, four reverse gear positions R1-R4 and neutral N. Each of the disks 30–38 have teeth and recesses arranged on their periphery. Each sensor will generate a "logic one" signal when a tooth is in register with the sensor and will generate a "logic zero" signal when a recess is in register with the sensor. The sensors are preferably Hall effect type sensors which are known in the art and would be used in combination with toothed wheels or linear toothed elements constructed of ferromagnetic or other material which produces a change in an electrical characteristic of the sensor.

The teeth and recesses constitute indicia which represent bits of binary words which form a code which represents the position of the disks, and thus, the position of the lever 12. The teeth and recesses are sized and spaced as shown in FIGS. 3a–3e so each position of the lever 12 will be represented by a unique five bit word.

Table I illustrates the words of a five bit Gray code having bit sequences corresponding the arrangement of sensors and disks shown in FIGS. 3a–3e. It can be seen in Table I that these five bit words form a type of Gray code wherein the words change only one bit at a time between adjacent positions. That is, adjacent words are identical except for one bit. From Table I it can also be seen that the words therein have an additional novel characteristic. In particular, if only one bit of any word is changed, then the modified word will either be a) identical to a word representing an adjacent position of the lever, or b) different from all the words which represent lever positions (an illegal word).

TABLE I

| GEAR | WHEEL/CODE | | | | |
| --- | --- | --- | --- | --- | --- |
|  | 30 | 32 | 34 | 36 | 38 |
| R4 | 1 | 1 | 0 | 1 | 1 |
| R3 | 0 | 1 | 0 | 1 | 1 |

TABLE I-continued

| GEAR | WHEEL/CODE | | | | |
|------|----|----|----|----|----|
|      | 30 | 32 | 34 | 36 | 38 |
| R2   | 0  | 1  | 0  | 0  | 1  |
| R1   | 0  | 1  | 0  | 0  | 0  |
| N    | 0  | 0  | 0  | 0  | 0  |
| F1   | 0  | 0  | 1  | 0  | 0  |
| F2   | 0  | 0  | 1  | 0  | 1  |
| F3   | 0  | 0  | 1  | 1  | 1  |
| F4   | 1  | 0  | 1  | 1  | 1  |
| F5   | 1  | 0  | 1  | 1  | 0  |
| F6   | 1  | 1  | 1  | 1  | 0  |
| F7   | 1  | 1  | 1  | 0  | 0  |
| F8   | 1  | 1  | 1  | 0  | 1  |

With a code having these characteristics, a transmission control system connected to the encoder 18 can be designed so that an electrical fault, such as a short or open circuit in any one (but only one) of the wires 20–28, or an error in any one (but only one) of the five bits, will cause the transmission to shift only to an adjacent gear or to neutral, if desired.

Although the present invention has been described in terms of what are at present believed to be its preferred embodiments, it will be apparent to those skilled in the art that various changes may be made to these embodiments without departing from the scope of the invention. For example, instead of using a magnetic type encoded element and sensor arrangement, optical sensors could be used in combination with an encoded element having sections of varying reflectivity or transmittance, such as found in known encoder structures. Similarly, magnetic field type sensors could be used in combination with magnetic encoded elements, or mechanical switches could be used in combination with structurally encoded elements. It is therefore intended that such structures are also encompassed by the following claims.

It will also be apparent to those skilled in the art that other sets of words forming a Gray code and having the characteristics identified above could be formulated. For example, such an alternate code could be formulated merely by rearranging the code wheels shown in FIGS. 2 and 3. It will also be apparent to those skilled in the art that the advantages of this invention may also apply to Gray codes having fewer or more than five bits, depending upon the number of positions to be encoded. It is intended that the application of this invention to such other codes is also encompassed by the following claims.

What is claimed is:

1. A position encoder for detecting the position of a member which is movable to a plurality of positions, the encoder having a plurality of encoded elements, the elements having indicia which represent a plurality of binary multi-bit position-representing words of a Gray code, each word being unique and representing only one of said plurality of positions, characterized by:

the indicia being arranged so that, for each and every word of the code, a modified word obtained by changing only one bit of any particular position-representing word will be:

a) identical to a word which represents a position of the movable member which is immediately adjacent to the position represented by said particular word; and b) different from all said position-representing words.

* * * * *

UNITED STATES PATENT AND TRADEMARK OFFICE
CERTIFICATE OF CORRECTION

PATENT NO.  :  5,049,879

DATED       :  17 September 1991

INVENTOR(S) :  Dean Homer Symonds

It is certified that error appears in the above-identified patent and that said Letters Patent is hereby corrected as shown below:

On the title page, item [54], and in column 1:
In the title, please change "UTILIZER" to -- UTILIZING --.

In Col. 4, line 31, delete "and" and insert -- or --.

Signed and Sealed this

Fifth Day of January, 1993

*Attest:*

DOUGLAS B. COMER

*Attesting Officer*  *Acting Commissioner of Patents and Trademarks*